United States Patent [19]

Siuta

[11] Patent Number: 5,202,153

[45] Date of Patent: Apr. 13, 1993

[54] METHOD FOR MAKING THICK FILM/SOLDER JOINTS

[75] Inventor: Vincent P. Siuta, Cherry Hill, N.J.

[73] Assignee: E. I. Du Pont de Nemours and Company, Wilmington, Del.

[21] Appl. No.: 749,161

[22] Filed: Aug. 23, 1991

[51] Int. Cl.$^5$ .............................................. B05D 5/12
[52] U.S. Cl. .................................. 427/125; 427/123; 427/126.2; 427/126.3; 427/265; 427/279; 427/374.4; 427/380; 427/383.1; 427/404; 427/419.3; 427/419.4; 427/419.6; 427/433
[58] Field of Search ...................... 427/125, 123, 126.2, 427/126.3, 265, 279, 380, 383.1, 404, 419.3, 419.4, 419.6, 374.4, 433

[56] References Cited

U.S. PATENT DOCUMENTS 5,033,666  7/1991  Keusseyan et al. ................. 228/122

OTHER PUBLICATIONS

U.S. Ser. No. 07/508,769, filed Apr. 12, 1990, by Nebe et al.

*Primary Examiner*—Bernard Pianalto

[57] ABSTRACT

A method for making a thick film/solder joint comprising the sequential steps of:
(1) applying a layer of first thick film conductor paste to an electrically non-conductive substrate in a pattern which has preselected solder pad areas and firing the layer;
(2) applying over the first thick film layer only within the solder pad area a layer of a second thick film conductor paste having a low frit content and firing the layer; and
(3) forming the solder joint by applying to the fired second thick film layer a layer of soft solder.

10 Claims, 8 Drawing Sheets

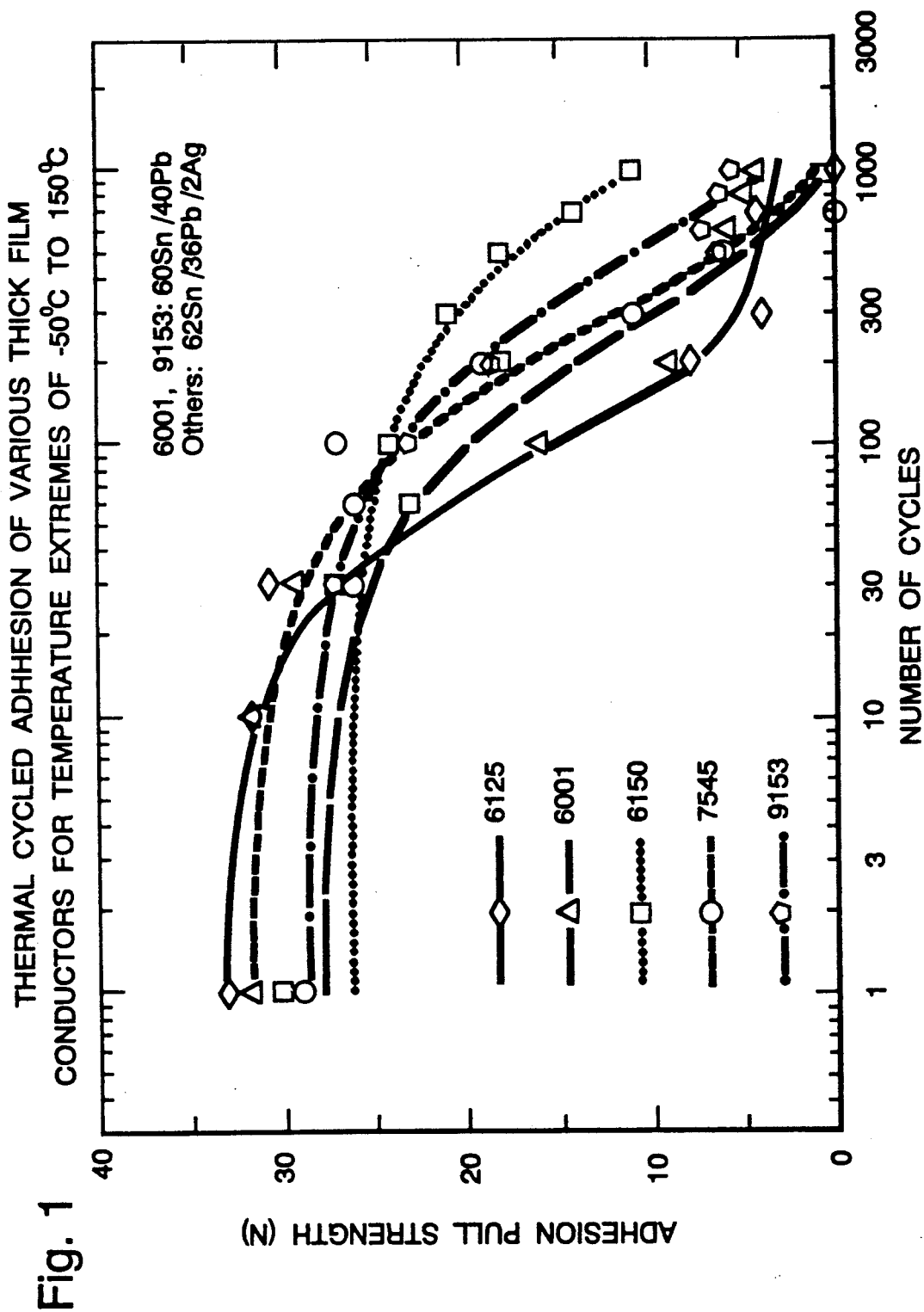

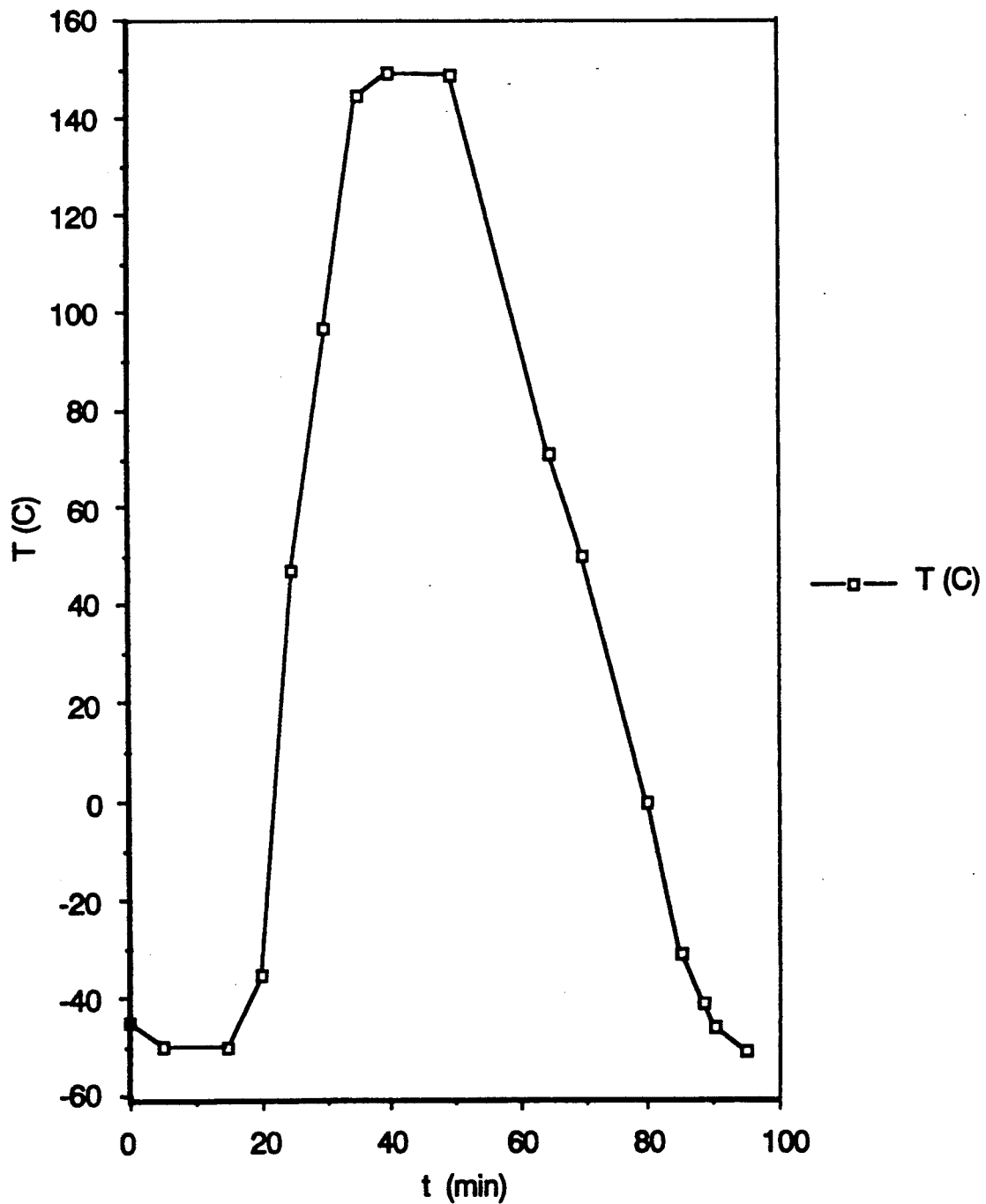

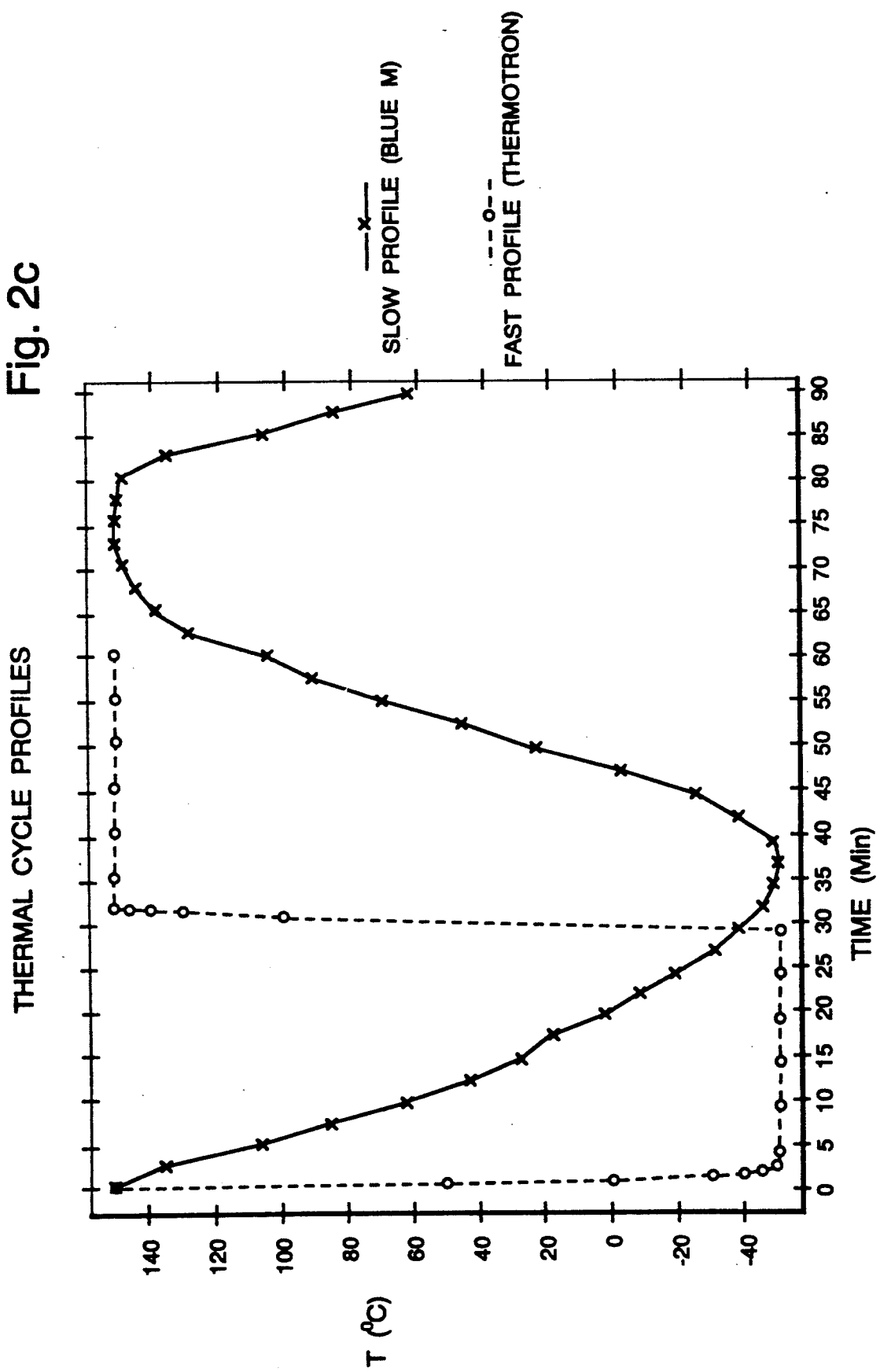

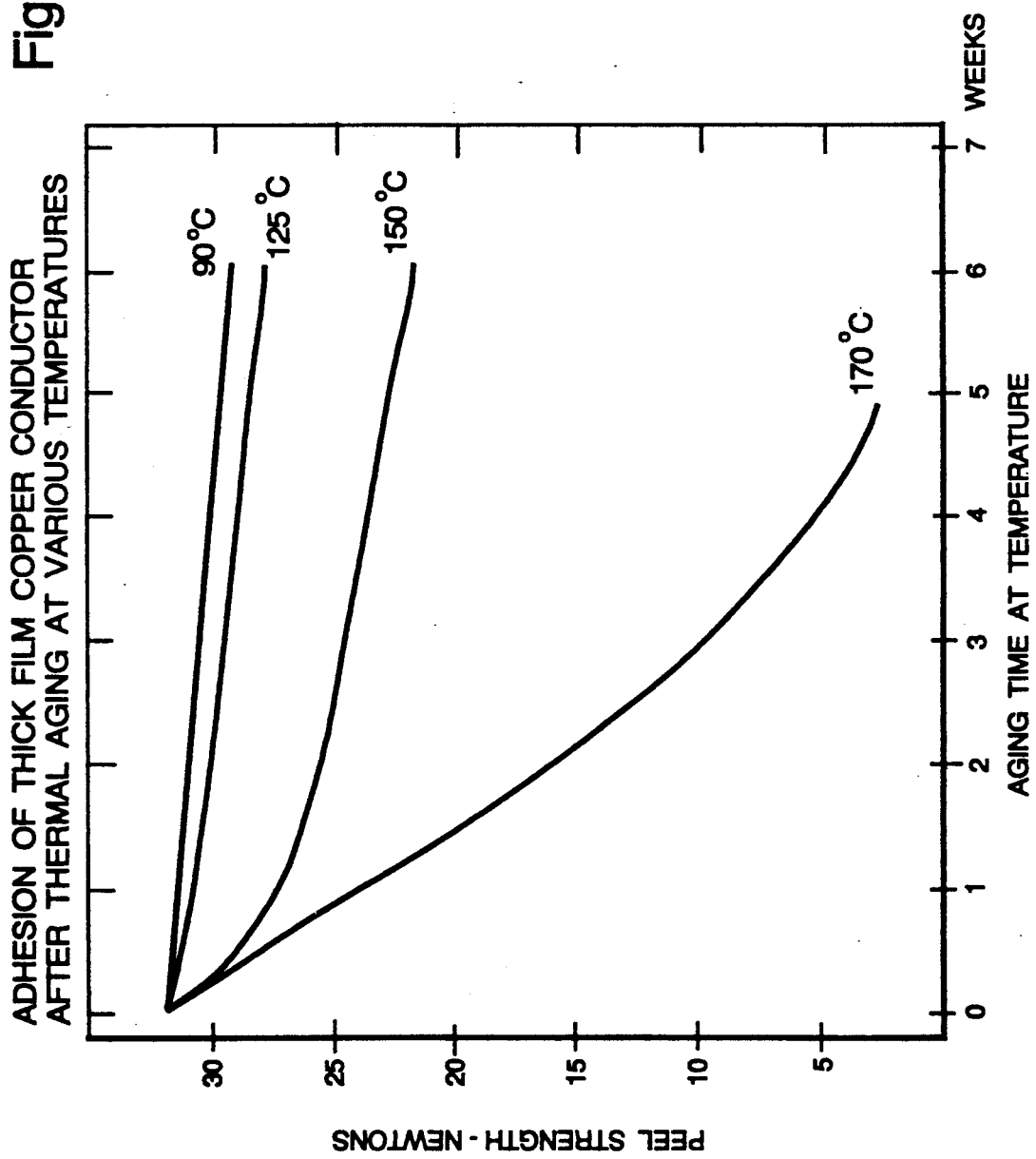

STANDARD PEEL TEST

MODIFIED PEEL TEST

METHOD FOR MAKING THICK FILM/SOLDER JOINTS

FIELD OF THE INVENTION

The invention is directed to a method for making thick film/solder joints and, in particular, it is directed to such a method which will produce thick film/solder joints which have good thermal cycled adhesion.

BACKGROUND OF THE INVENTION

The current trend in the microelectronics industry is to surface mount integrated circuits and other components onto thick film metallized substrates. Although this is a cost effective interconnection and packaging method which lends itself to mass production, certain reliability problems have been encountered in trying to implement its approach. Soldering, which is the preferred method for attaching leads and IC packages, can lead to solder joint failures-particularly on thermal cycling. This has severely limited the use of thick films for certain applications such as automotive electronics and some military and high power applications where good thermal cycled performance is essential.

The engine compartment of an automobile is a particularly severe environment where circuits encounter temperatures of 150C. during normal operation and excursions to 160 to 170C. for short times after the engine is stopped. Conversely, in some areas, the ambient temperature can drop to $-50$C. Although the above temperatures represent extreme conditions, the circuit must be able to withstand a significant number of thermal cycles in this temperatures range without appreciable degradation in adhesion to avoid catastrophic failure. This ability to withstand thermal cycling conditions, i.e., thermal cycled adhesion (TCA), is becoming even more important because of the longer warranty periods that are now being offered by automobile manufacturers.

Conventional Ag/Pd thick film conductors soldered with Sn/Pb eutectic solder exhibit relatively poor thermal cycled adhesion. Sn/Pb solders have a much higher thermal coefficient of expansion (TCE) than the alumina substrate and thick film conductor. This mismatch in TCE results in high tensile stresses in Sn/Pb solder joints made to thick film conductors.

Although surface mount technology (SMT) is an attractive assembly method for high density electronic systems, there are still problems which must be solved. LCC, MLC, and other chip components are generally attached to alumina or ceramic multilayer interconnect boards via reflow of Sn/Pb solder paste. Since a large TCE mismatch exists between the substrate, metallization and solder, it is apparent that a tensile strain will be induced into the thick film at the base of the solder fillet. For the case of a solder copper thick film on an alumina substrate, the strain $\epsilon$ due to the TCE mismatch can be estimated as follows:

For soldered Cu film thermally cycled between $-50$ and $+150$C.

$$\epsilon = \Delta \alpha \cdot \Delta T$$

$$\epsilon = (25-6)(200) = 3800 \text{ ppm}$$

The tensile stress in the copper film, $\sigma_{cu}$, can be estimated from Hookes law:

$$\sigma_{cu} = \epsilon E$$

where E is Young's modulus of Elasticity.

For thermal cycling between $-50$ and $+150$C., the tensile stress is estimated to be:

$$\sigma_{cu} = 3800 \times 10^{-6} \cdot 3 \times 10^{6} = 11,400 \text{ psi (tension)}.$$

This calculation is only approximate because $\alpha_{cu}$ (thick film) is less than $\alpha_{cu}$ (bulk) and some of the tensile stress will be relieved by plastic flow in the solder an copper. More accurate estimates of stresses in SMT solder joints have been made by the Finite Element Method (FEM) of analysis. The FEM results indicate tensile stresses of the same order of magnitude. Obviously, the presence of an LCC or IC chip further complicates the stress situation.

The important point is that tensile stresses due to TCE mismatch are considerable and any cracks which develop and propagate in the thick film conductor, dielectric, or IC chips can result in open circuit failures.

In addition to stresses caused by large differences in TCE, thick film solder pads are subjected to a number of mechanical and chemical interactions on thermal cycling which degrade adhesion, namely:

Tin diffusion from the solder into the film with the formation and growth of intermetallic compounds.

Formation of a weak, Pb-rich zone in the solder.

High strains due to the large TCE mismatch between solder fillet and film/substrate.

Creep related processes including coalescence of microvoids and oxidation of the solder.

Crack propagation through the solder/conductor to the substrate/dielectric interface.

Typical data for thermal cycled adhesion degradation of soldered thick film conductors are shown in FIG. 1. All the curves exhibit a small initial drop in adhesion upon thermal cycling, followed by a rapid decline after extended cycling.

SUMMARY OF THE INVENTION

In a first aspect, the invention is directed to a method for making thick film/solder joints having a preselected area comprising the sequential steps of (1) applying to an electrically non-conductive substrate a patterned layer having a preselected solder pad area of a first thick film conductive composition comprising finely divided particles of (a) 85.0-98.5% wt. of a pure unalloyed conductive metal or low alloy thereof selected from Au, Ag and Cu having a particle size of 0.5-5 microns, (b) 1-10% wt. inorganic binder, and (c) 0.5 to 5.0% wt. spinel-forming metal oxide, all of (a), (b) and (c) being dispersed in organic medium;

(2) firing the first thick film conductive composition layer to effect volatilization of the organic medium therefrom and liquid phase sintering of the inorganic binder;

(3) applying over only the solder pad area of the fired first thick film conductive layer a layer of second thick film conductor composition comprising (a) 94.0-99.3% wt. pure unalloyed conductive metal or low alloy of a metal selected from Au, Ag, and Cu having a particle size of 0.5-10 microns, (b) 0.2-1.0% wt. inorganic binder, and (c) 0.5-5.0% wt. spinel-forming metal oxide, all of (a), (b) and (c) being dispersed in organic medium;

(4) firing the second thick film conductive layer to effect volatilization of the organic medium therefrom and liquid phase sintering of the inorganic binder; and (5) forming the solder joint by applying to the solder pad area of the fired second thick film conductive layer a layer of soft, low-Sn solder having a melting point of 120–200C.

In a second aspect, the invention is directed to a method for making a thick film/solder joint having a preselected area comprising the sequential steps of:

(1) applying to an electrically non-conductive substrate a patterned layer having a preselected solder pad area of a thick film conductive composition comprising finely divided particles of (a) 85.0–98.5% wt. of a pure unalloyed conductive metal or low alloy thereof selected from Au, Ag and Cu having a particle size of 0.5–5 microns, (b) 1–10% wt. inorganic binder, and (c) 0.5–5.0% wt. spinel-forming metal oxide, all of (a), (b) and (c) being dispersed in organic medium;

(2) firing the thick film conductive composition layer to effect volatilization of the organic medium therefrom and liquid phase sintering of the inorganic binder;

(3) applying over the exposed areas of the substrate circumscribing the solder pad area and to the outer edges of the thick film conductor within the solder pad area a thick film dielectric composition comprising finely divided particles of glass dispersed in organic medium;

(4) firing the thick film dielectric composition to effect volatilization of the organic medium therefrom and sintering of the glass therein; and (5) forming the solder joint by applying to the surface of the thick film conductive composition which remains exposed on the solder pad area a layer of soft solder having a melting point of 120–300C.

BRIEF DESCRIPTION OF THE DRAWING

The Drawing consists of seven figures as follows:

FIG. 1 is a graphical correlation of adhesion as a function of the number of thermal cycles for a variety of thick film materials;

FIG. 4 is a graphic correlation of thick film conductor adhesion with aging at various temperatures;

DETAILED DESCRIPTION OF THE INVENTION

A. In General

The performance of thick film conductors subjected to thermal cycle tests can be improved by controlling several materials, process and design factors. For example, pure, ductile thick films with low glass binder content such as Ag or Cu exhibit higher thermal cycled adhesion than Ag/Pd alloy conductors. Likewise, thick, dense films exhibit greater thermal cycled adhesion than thin, porous films because it takes longer for tin diffusers from the solder to penetrate through the thick, dense film.

Solder composition and soldering conditions also play an important role. Thick films soldered with low yield strength, low-Sn or Sn-free solders perform better in thermal cycling because some stress relief occurs due to plastic deformation in the solder. Also, embrittlement of the thick film due to $M_xSn_y$ intermetallic formation is reduced because of the lower tin content.

Sometimes on thermal cycling, fatigue failure of the solder joint occurs instead of failure at the thick film-/substrate interface. This can be minimized by producing fine-grained, void-free solder joints and by employing solder compositions which have high fatigue strength. The Coffin-Manson equation is useful in comparing the fatigue strength of solders thermally cycled under various conditions.

$$Nf^{\rho}\cdot\Delta\epsilon = \text{Constant}$$

Following is a list of factors which affect thermal cycled adhesion of thick film conductors. By controlling a combination of these factors, the performance of thick film materials on thermal cycling can be significantly improved.

B. Metallurgy

Thick film compositions of pure metals such as Ag, Cu, and Au or low alloys of these metals perform better on thermal cycling than hard, brittle alloys like 30/70 Pd/Ag. Pure metals and their low alloys are softer (low modulus) and therefore can relieve thermal cycling stresses by plastic flow. Furthermore, thick film Ag, Cu, and Au densify on firing without requiring large amounts of glass binder which makes the film brittle. Stress relief by plastic deformation inhibits crack propagation and results in higher thermal cycled adhesion.

As used herein, the term "low alloy" means that the primary conductive metal contains no more than 5% by weight of secondary alloying metal such as a 95/5 Ag/Pd alloy.

G. Fired Film Thickness

Figure 3:
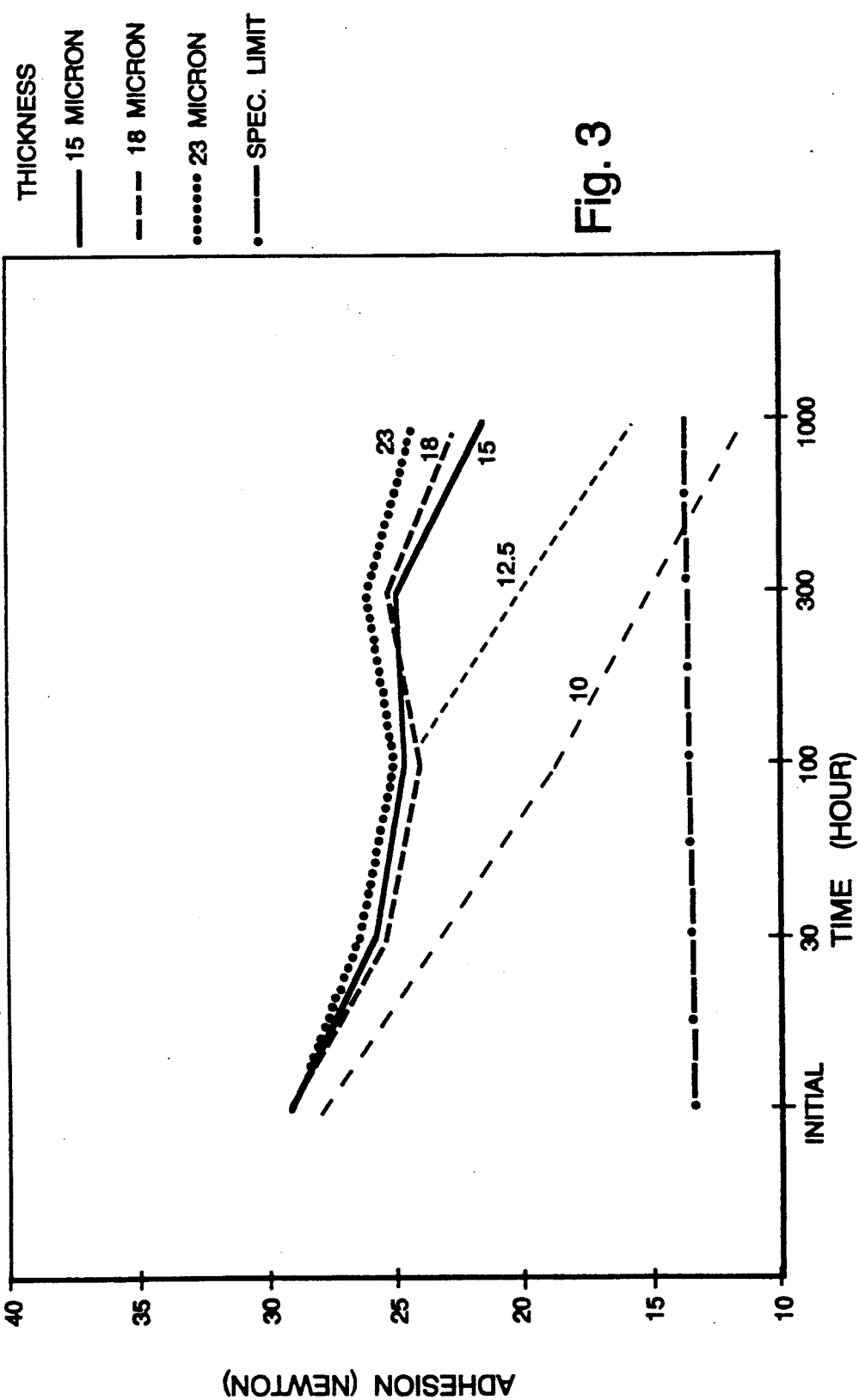
FIG. 3 is a graphical correlation of adhesion as a function of aging time showing the effect of fired film thickness of the conductor.

As shown by the data presented graphically in FIG. 3, the use of thicker fired films improves aged adhesion. If sufficient thickness cannot be obtained in a single printing and firing operation, several conductor layers can be applied by sequential printing and firing or by cofiring two or more layers.

Standard thick film conductors are designed to have good solderability and adhesion when fired on 96% alumina substrates or over dielectric. When two layers of a conductor are built up by sequential firing, the top layer often will not have adequate solderability. This difficulty can be overcome by using a different composition for the top layer which contains less frit than the standard conductor designed for firing on ceramic. Therefore for optimum overall performance, multiple layer thick films may require different compositions for the bottom and top layers—particularly if the layers are sequentially fired rather than cofired.

In general, the first layer on the ceramic should be a thick film conductor with good TCA (dense, pure or low alloy metal film with mixed bonding) and the top layer should be a conductor with good aged adhesion (i.e., low frit and resistance to leaching and degradation by tin solders). Therefore a thick film conductor consisting of two layers of optimum composition will exhibit superior aged and thermal cycled adhesion to either single layer alone. More particularly, the first conductive thick film layer should contain 1-15% wt. mixed oxide/frit inorganic binder. At least 1% wt. inorganic binder is needed to get adequate particle bonding. However, more than 15% wt. is likely adversely to affect TCA. On the other hand, the second lower frit conductive thick film layer should contain 0.7-6.0% wt. mixed oxide/frit inorganic binder. At least 0.7% wt. inorganic binder is needed to get adequate bonding to the underlying thick film conductive layer, but more than 6.0% inorganic binder is likely adversely to affect solderability of the layer.

It should be mentioned that cofiring of more than one or two layers of Cu in nitrogen can lead to organic burnout problems and therefore is not preferred in the practice of the invention.

D. Composite/Gradient Thick Films

The above section discussed the benefits of using two or more layers of conductor of different composition but the same metallurgy, i.e., Ag or Cu or Au. Improved performance can result from using two different metallurgies, e.g., Ag and Cu and two different firing profiles.

For example, Du Pont 6160 Ag has excellent thermal cycled adhesion but poor solder leach and migration resistance and marginal long-term aged adhesion. By overprinting 6160 Ag fired in air at 850C. with a Cu thick paste (QS190) fired in nitrogen at 600C., a composite conductor is obtained which has the following advantages:

High conductivity
Excellent solderability
Good solder leach resistance
Resistance to migration
High aged adhesion
High thermal cycled adhesion
Low Cost The overprint Cu must be fired in nitrogen below the Ag-Cu eutectic temperature of 780C. to avoid melting. However, the composite Ag-Cu thick film exhibits a combination of properties which cannot be achieved from Ag or Cu alone.

E. Edge Encapsulation

In the course of the studies on which the invention is based, it has been found that both AA and TCA of the copper conductive layers can be enhanced by edge encapsulation. By "edge encapsulation", it is meant that a fired layer of dielectric composition is applied over the outer edges of the fired thick film conductor and the exposed areas of the substrate surrounding the solder pad.

Turning now to FIG. 5 of the Drawing, it consists of seven figures (5a through 5g) which illustrate both the overprinting of thick film conductive layers and edge encapsulation to improve the AA and TCA of thick film conductive layers.

Figure 5A:
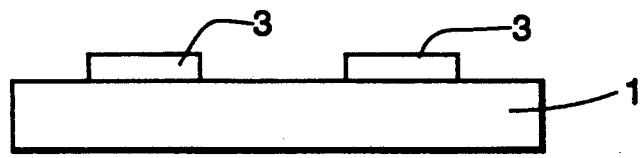
FIG. 5 is a schematic representation of the steps of the invention which are required to make a soldered thick film conductor element.
Figure 5B:
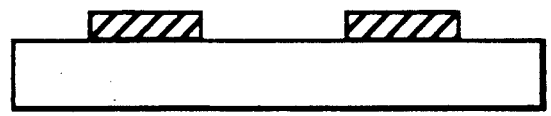
Figure 5C:
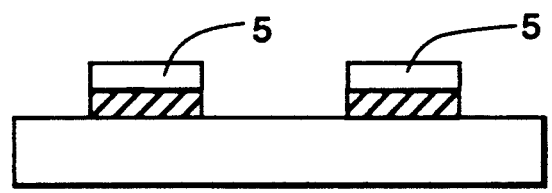
Figure 5D:
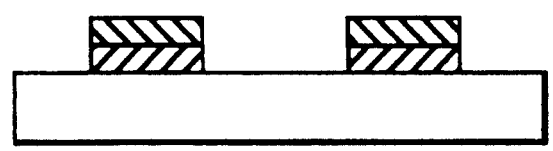
Figure 5E:
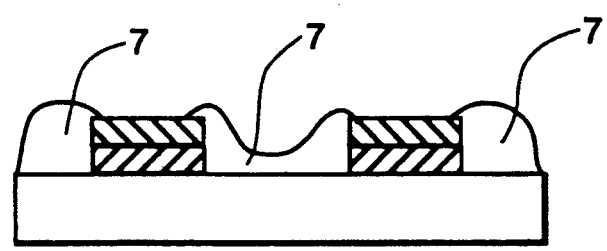
Figure 5F:
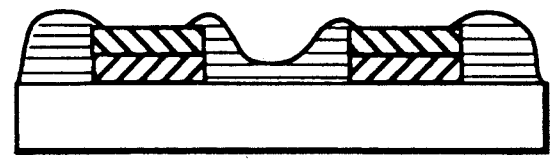
Figure 5G:
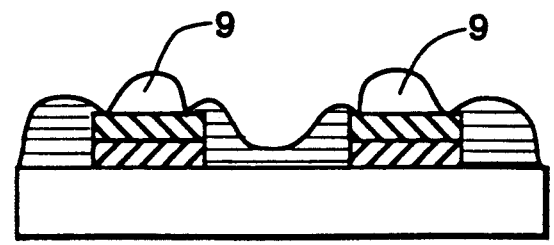

As shown in FIG. 5a, a first thick film conductive layer 3 is applied by screen printing onto an alumina substrate 1. Upon completion of drying the paste, the layer 3 is fired at 800°-950° C. to effect volatilization of the remaining organic medium in the paste and to sinter the inorganic binder (FIG. 5b). A second layer of thick film conductive paste 5 is then printed over the fired layer 3 and dried (FIG. 5c). After drying, the second thick film conductive layer 5 is fired in effect volatilization of the organic medium in the paste and to sinter the inorganic binder (FIG. 5d). A layer of dielectric thick film paste 7 is then applied over the exposed areas of the substrate 1 and the edges of the top fired conductive layer 5 (FIG. 5e) and the dielectric layer 7 is fired to effect volatilization of the organic medium and sintering of the dielectric solids (FIG. 5f). Soldering is then accomplished by applying molten solder 9 to the exposed areas of the top conductive layer 5 and cooling the solder to room temperature (FIG. 5g).

F. Barrier Layers

Poor TCA performance is caused by high stresses due to TCE mismatch which are superimposed on the aging and interaction mechanisms as discussed hereinabove. These stresses can be reduced by using low modulus, high fatigue strength solders. Another approach is to use a barrier layer to inhibit solder/thick film interactions which degrade TCA.

The main purpose of the barrier layer is to prevent Sn diffusion into the film and the attendant formation of a weak, Pb-rich zone in the solder joint. Nickel is an effective diffusion barrier because $Ni_xSn_y$ intermetallics grow at a very slow rate. However electroless and electrolytic processes must be carefully selected to prevent destruction of the glass/oxide thick film bond by acidic plating solutions.

R. Keusseyan in copending allowed U.S. patent application Ser. No. 07/508,871 filed Apr. 12, 1990 and W. Nebe et al. in copending U.S. patent application Ser. No. 07/508,769 filed Apr. 12, 1990 disclose the use of thick film compositions as barrier layers to enable soldering or brazing of connectors to thick film conductor layers.

G. Solder Composition/Joint Design

Solder Composition: It is possible to reduce stresses in the solder joint and to inhibit some of the unwanted reactions listed above by avoiding the use of Sn-bearing solders. For example, the use of Sn-free solders prevents the formation of intermetallic compounds which degrade adhesion. As shown in subsequent examples, copper thick films soldered with 50 In/50 Pb solders have excellent aged and thermal cycled adhesion. Likewise, low-Sn or Sn-free solders will minimize/eliminate in diffusion of Sn from the solder (into the thick film and wire) which causes a weak, Pb-rich zone in the solder joint. This often results in type-B failures in the solder joint after prolonged aging or thermal cycling. (See Section K below.)

The high cost of indium solders has restricted its use for many applications. However, it is clear that eutectic Sn/Pb solders are definitely *not* the optimum composition for applications that require good thermal cycled performance.

Effect of Solder Joint Characteristics on Thermal Cycled Adhesion: Low yield strength soft solders (e.g. In and Pb base alloys) are able to withstand thermal cycling better than higher yield strength Sn/Pb eutectic solders because some stress relief occurs due to plastic deformation in the solder. Furthermore, because of their low modulus, the stresses developed on thermal cycling to low temperatures is lower than with high yield strength solder alloys.

Another important consideration is the integrity of the solder joint. For best thermal cycled performance, soldering conditions should be controlled to produce fire-grained, void-free solder joint. Furthermore, solder joint designs which minimize plastic strain, $\Delta\epsilon_p$, in the solder will reduce fatigue cracking of the solder joint.

Fine Grain, Void-Free Solder Joints: Conventional Sn/Pb solders shrink about 4% in volume upon solidification. This causes voids to develop in the solder joint. These voids increase in size and number when tin diffuses from the solder into the conductor to form intermetallic compounds. Voids also develop and grow by creep related mechanisms during elevated temperature aging and/or thermal cycling of the solder joint. As a result, failure eventually occurs in the weak, tin-depleted zone of the solder joint.

Fine grains are stronger and resist grain boundary sliding better than coarse grains. Therefore, for improved thermal cycled performance, soldering conditions should be used which develop a fine, uniform grain structure in the solder joint. Reflow soldering in conveyor belt furnaces with slow cooling through the solidification temperature range promotes grain growth and therefore should be avoided. Soldering processes which involve rapid solidification without solder flux entrapment and gas evolution to yield dense, fine-grained solder joints are preferred for applications which require high thermal cycled adhesion.

H. Inorganic Binder

The inorganic binder for the thick film conductor paste must be a low softening point glass having a dilatometer softening point 300-800C. In particular the softening point of the glass should be such that it causes liquid phase sintering, i.e., it begins to flow, before the conductive metal component undergoes sintering and densification during cofiring.

A wide range of glass compositions can be used as the inorganic binder of the thick film conductor so long as the above-mentioned criteria are fulfilled. In particular, amorphous silicates, borosilicates and borates of lead and bismuth have been found to be particularly suitable in combination with up to 50% by weight glass modifiers such as alkali metal oxides, alkaline earth metal oxides and transition metal oxide. Mixtures and precursors of these components may be used as well.

Optionally, the binder component may also containing supplemental fluxing agents such as $Bi_2O_3$ and PbO.

I. Spinel-Forming Metal Oxides

It is preferred that the conductive layer atop the substrate contain a spinel-forming divalent metal oxide for the purpose of improving further the adhesion of the conductive layer to the substrate. At least 0.5% wt. of the spinel-former should be used to have any observable technical effect and preferably at least 1.0% wt. In any event, the amount of spinel-forming metal oxide should be sufficient to react with the $Al_2O_3$ at the $Al_2O_3$ thick film interface. On the other hand, it is preferred to use not more than 5.0% wt. spinel-forming oxides so as not to adversely affect the solderability of the conductive layer.

As used herein, the term "spinel-forming metal oxide" refers to divalent metal oxides which, under the firing conditions of the invention, are capable of forming spinels ($MeAl_2O_4$) by reaction with an underlying alumina substrate. While the exact mechanism by which these metal oxides function is not known, it is believed that the metal oxides are transported through the glass phase to the ceramic substrate where they interact with the surface of the $Al_2O_3$ substrate to form a mechanically strong spinel structure.

Suitable inorganic oxides are those based upon $Zn^{2+}$, $Mg^{2+}$, $Co^{2+}$, $Cu^{2+}$, $Ni^{2+}$, $Fe^{2+}$ and $Mn^{2+}$ ions, Precursors of the metal oxides, such as carbonates and oxalates which will decompose under firing conditions to form the corresponding metal oxides, may be used with comparable effectiveness.

J. Organic Medium

The inorganic particles are mixed with an essentially inert liquid medium (vehicle) by mechanical mixing (e.g., on a roll mill) to form a pastelike composition having suitable consistency and rheology for screen printing. The latter is printed as a "thick film" on conventional dielectric substrates in the conventional manner.

Any inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineol and the like, solutions of resins such as the polymethacrylates of lower alcohols and solutions of ethyl cellulose in solvents such as pine oil and the monobutyl ether of ethylene glycol monoacetate. A preferred vehicle is based on ethyl cellulose and beta-terpineol. The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage, the dispersions will contain complementally 60-90% solids and 40-10% vehicle. The compositions of the present invention may, of course, be modified by the addition of other materials which do not affect its beneficial characteristics. Such formulations is well within the skill of the art.

The pastes are conveniently prepared on a three-roll mill. The viscosity of the pastes is typically within the following ranges when measured on a Brookfield HBT viscometer at low, moderate and high shear rates:

| Shear Rate ($sec^{-1}$) | Viscosity (Pa.s) | |
| --- | --- | --- |
| 0.2 | 100–5000 | |
| | 300–2000 | Preferred |
| | 600–1500 | Most Preferred |
| 4 | 40–400 | |
| | 100–250 | Preferred |
| | 140–200 | Most Preferred |
| 384 | 7–40 | |
| | 10–25 | Preferred |
| | 12–18 | Most Preferred |

The amount of vehicle utilized is determined by the final desired formulation viscosity.

K. Formulation and Application

In the preparation of the compositions of the present invention, the particulate inorganic solids are mixed with the organic carrier and dispersed with suitable equipment, such as a three-roll mill, to form a suspension, resulting in a composition for which the viscosity will be in the range of about 100-200 pascal-seconds at a shear rate of 4 $sec^{-1}$.

In the examples which follow, the formulation was carried out in the following manner:

The ingredients of the paste, minus about 5% organic compounds equivalent to about 5% wt., are weighed together in a container. The components are then vigorously mixed to form a uniform blend; then the blend is passed through dispersing equipment, such as a three-roll mill, to achieve a good dispersion of particles. A Hegman gauge is used to determine the state of dispersion of the particles in the paste. This instrument consists of a channel in a block of steel that is 25 μm deep (1 mil) on one end and ramps up to 0" depth at the other end. A blade is used to draw down paste along the length of the channel. Scratches will appear in the channel where the agglomerates' diameter is greater than the channel depth. A satisfactory dispersion will give a fourth scratch point of 10-18 typically. The point at which half of the channel is uncovered with a well dispersed paste is between 3 and 8 typically. Fourth scratch measurement of >20 μm and "half-channel" measurements of >10 μm indicate a poorly dispersed suspension.

The remaining 5% consisting of organic components of the paste in then added, and the resin content is adjusted to bring the viscosity when fully formulated to between 100 and 200 Pa.s at a shear rate of 4 sec$^{-1}$. The composition is then applied to a substrate, such as alumina ceramic, usually by the process of screen printing, to a wet thickness of about 30-80 microns, preferably 35-70 microns, and most preferably 40-50 microns. The electrode compositions of this invention can be printed onto the substrates either by using an automatic printer or a hand printer in the conventional manner, preferably automatic screen stencil techniques are employed using a 200- to 325-mesh screen. The printed pattern is then dried at below 200C., about 150C., for about 5-15 minutes before firing. Firing to effect sintering of both the inorganic binder and the finely divided particles of metal is preferably done in a well ventilated belt conveyor furnace with a temperature profile that will allow burnout of the organic matter at about 300-600C., a period of maximum temperature of about 700-1000C. lasting about 5-15 minutes, followed by a controlled cooldown cycle to prevent over sintering, unwanted chemical reactions at intermediate temperatures or substrate fracture which can occur from too rapid cooldown. The overall firing procedure will preferably extend over a period of about 1 hour, with 20-25 minutes to reach the firing temperature, about 10 minutes at the firing temperature and about 20-25 minutes in cooldown. In some instances, total cycle times as short as 30 minutes can be used.

L. Test Procedures

Solderability: The solderability tests were performed as follows: The fired parts were dipped in a mildly active rosin flux such as Alpha 611, then heated for 3 seconds by dipping the edge of the ceramic chip in the molten solder. The chip was then submerged in the solder for 10 seconds, withdrawn, cleaned and inspected. Solderability was determined by the percentage of solder coverage (buildup) obtained on the thick film test pattern.

Adhesion: The adhesion was measured using an "Instron" pull tester in a 90° peel configuration at a pull rate of 2 inches per minute. Twenty gauge pre-tinned wires were attached to 80 mil×80 mil pads by solder dipping for 10 seconds in 62 Sn/36 Pb/2 Ag solder at 220C. or in 60 Sn/40 Pb solder at 230C. using Alpha 611 flux. (Alpha 611 is a tradename for solder flux made by Alpha Metals Inc., Jersey City, N.J.) Aging studies were carried out in air in a Blue M Stabil-Therm® oven controlled at 150° C. After aging, test parts were allowed to equilibrate several hours in air before the wires were pulled. A peel force of at least 15 newtons after 1000 hours aging at 150° C. is considered to be essential or most applications.

Figure 6:
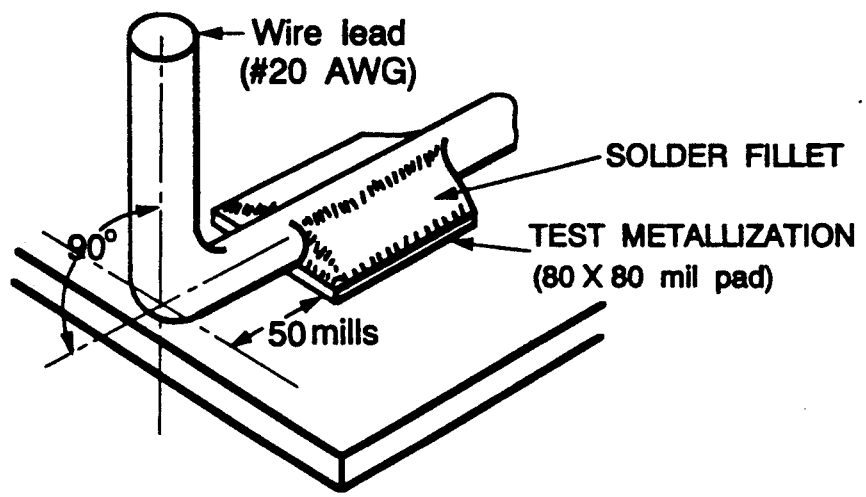
FIG. 6 is a drawing of the adhesion test bond configuration.
Figure 7A:
FIG. 7 is a schematic cross sectional representation comparing the configurations of the standard and modified peel tests.
Figure 7B:
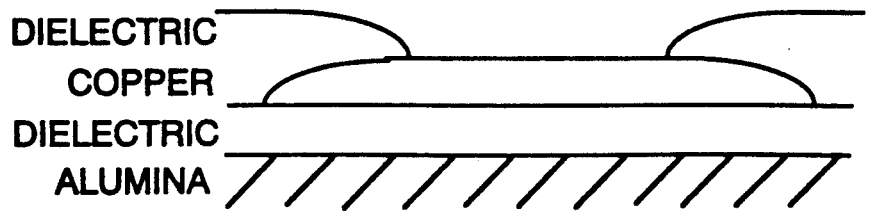

The standard configuration of the Du Pont "peel" adhesion test is shown in FIG. 6. The only difference in the modified peel test is that the thin edges of the thick film are encapsulated with a dielectric. Therefore, the full thickness of the conductor resists shear failure due to high tensile stresses at the base of the solder fillet, leading to improved TCA. Solder joint failures can be characterized as follows:

Type A. Conductor/substrate interface failure (pad lift-off);
Type B. Conductor/solder failure;
Type C. Wire pull out from solder; and
Type D. Substrate failure (divoting).

Thermal Cycled Adhesion (TCA): The TCA test employs the same adhesion (peel) test described in L above. However, instead of measuring adhesion after isothermal aging at 150C., the sample is tested after thermal cycling between two temperatures.

Thermal cycle test conditions such as ΔT, transition rate, film thickness, solder joint design, etc., must be carefully selected in order to accurately predict performance under actual service conditions. For example, extreme thermal shock conditions (large ΔT and transition time ≦2 minutes) can cause brittle fracture of the alumina substrate which may not accurately represent the type of failures observed under actual use conditions (e.g., automotive engine compartment). Likewise, cycling of soldered thick film through large ΔTs often results in failure due to fatigue cracking through the solder joint. Therefore the rate of transition and the temperature extremes on thermal cycling must be controlled to ensure that failure modes in accelerated tests are the same as those observed in the field. FEM analysis of stresses in various solder joint designs subjected to thermal cycling can be helpful in understanding observed failure modes under various processing and testing conditions.

Two types of thermal cycle equipment are generally used which differ in the transition rate between temperature extremes.

In single chamber equipment, the test assembly is placed in a single chamber and the heating and cooling cycles are carried out alternately in that chamber. In a dual chamber apparatus, one chamber is heated, the other is cooled, and the test assembly is transferred between them to obtain the temperature cycles. A suitable single chamber device is the VR CO8-PJ-3WG model made by Blue M Corporation. Blue Island, Ill. A suitable dual chamber device is the model ATS-320 made by Thermonics, Santa Clara, Calif.

Figure 2A:
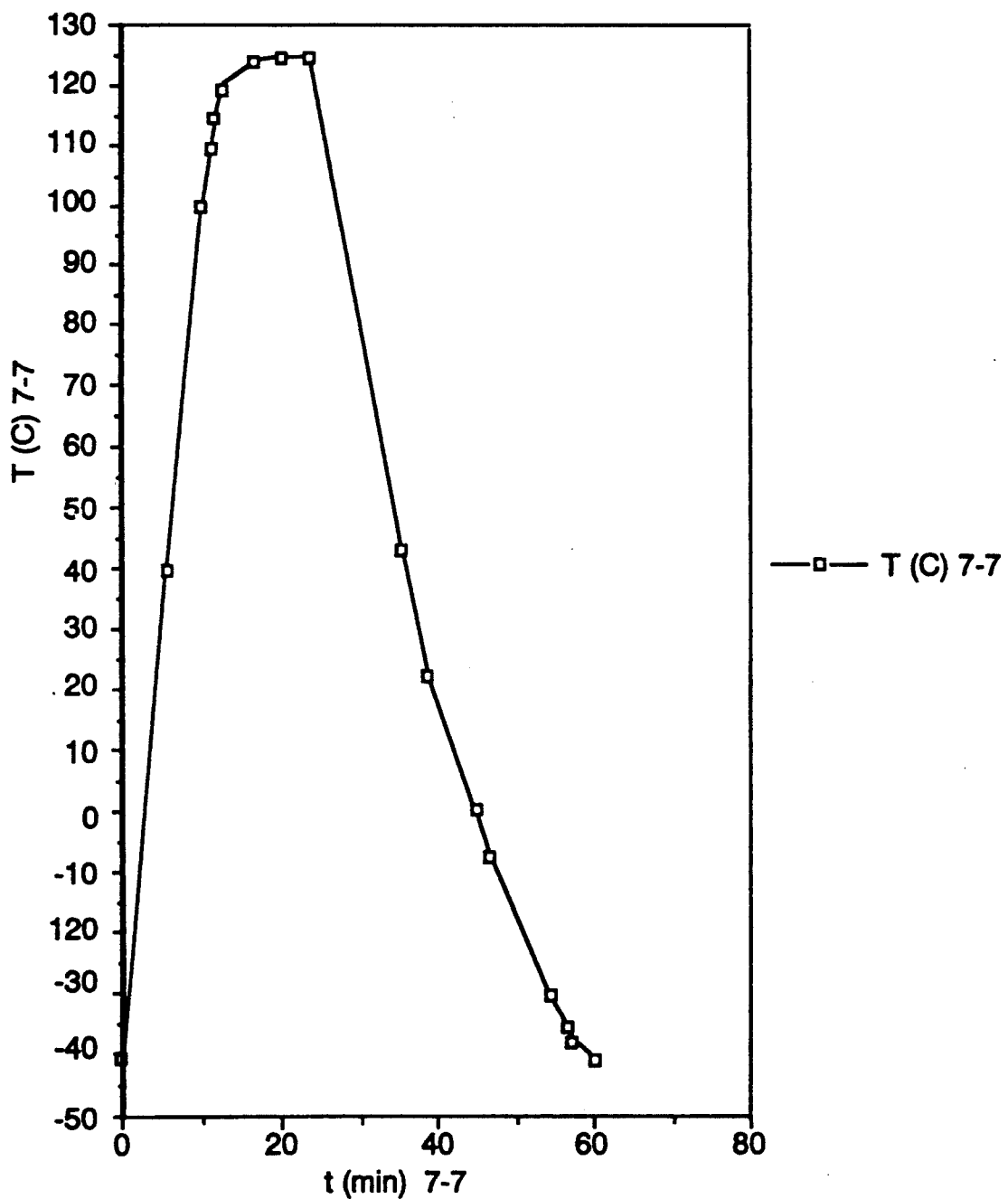
FIG. 2 is a graphical representation of three thermal cycle profiles which were used in the evaluation of the invention.

The transition rate of the single chamber units is determined by the size of the refrigeration unit, thermal mass of the chamber plus load and the ΔT range. FIGS. 2a and 2b show typical thermal cycle profiles that were combined with the Blue M equipment and used to generate the data given herein. Two standard ΔT profiles were used:

−40 to +125C. (FIG. 2a)
−50 to +150C. (FIG. 2b)

Because the Thermotron ® dual-chamber unit consists of hot and cold chambers maintained at the desired temperature extremes and the test samples cycle rapidly between the hot and cold chambers, the transition rate between temperature extremes is much more rapid than in the single chamber equipment.

FIG. 2c compares the "slow" vs. "fast" thermal cycle profiles obtained with the two types of equipment from −50 to +150C.

EXAMPLES

Examples 1-12

A number of thick film conductor compositions marketed by E. I. du Pont de Nemours and Co. were screen printed onto alumina and over Du Pont 5704 thick film glass dielectric. The dielectric was printed into layers and each layer was printed, dried and fired separately. All conductors were fired five times in air at 850C. except 9922 Cu, which was fired at 900C. in N2. The thick film compositions are described in Table 1.

TABLE 1

| Description of Thick Film Conductors | | |
|---|---|---|
| Conductor | Binder | Composition - Ag/Pd Ratio |
| 4093 Ag/Pd/Pt | Mixed | 2.5/1 + 4% Pt |
| 4596 Au/Pt/Pd | Mixed | 15% Pt/2.5% Pd |
| 6125 Ag/Pd | Mixed | 2.5/1 |
| 6134 Ag/Pd | Mixed | 6/1 |
| 6160 Ag | Mixed | Ag |
| 9476 Ag/Pd/Pt | Glass | 1.8/1 + 2% Pt |
| 9922 Cu | Mixed | Cu |
| 9924 Cu | Mixed (higher frit) | Cu |
| 6001 Cu | Mixed (higher frit) | Cu |
| 9153 Cu | Mixed - for firing at 900° C. | Cu |
| 9163 Cu | Mixed - for firing at 900° C. | Cu |
| 41062 Δ Cu | Mixed | Cu |
| 41085 Δ Cu | Mixed | Cu |
| QS 170 Ag/Pt | Mixed | 100 Ag/1 Pt |
| QS 180 Ag | Mixed | Ag |

Each of the thick film pastes listed in Table 1 was printed on either alumina or Du Pont 5704 glass dielectric as described hereinabove and adhesion was measured after thermal cycling as indicated in Tables 2 and 3, which follows.

TABLE 2

| | Adhesion of DuPont Thick Film Conductors After Thermal Cycling (−55 to +125 C.) | | | | | | | | |
|---|---|---|---|---|---|---|---|---|---|
| | | Firing Cycle | Fired Thick | Average Adhesion (Newtons) Cycles | | | | | |
| Ex. No. | Conductor | min. | μm | 0 | 30 | 100 | 300 | 600 | 1000 |
| 1 | 6125 on alumina | 30 | 14 | 30.7 | 16.4 | 12.0 | 7.6 | 7.2 | 3.6 |
| 2 | 6125 on 5704 | 30 | 14 | 28.9 | 17.8 | 8.0 | 3.1 | 2.2 | 0.9 |
| 3 | 6134 on alumina | 30 | 14 | 27.6 | 14.2 | 8.4 | 9.8 | 6.6 | 0.9 |
| 4 | 6134 on 5704 | 30 | 13 | 28.9 | 12.0 | 6.6 | 3.3 | 3.1 | 4.4 |
| 5 | 6134 on alumina | 60 | 14 | 31.1 | 10.2 | 7.1 | 3.6 | 3.2 | 1.3 |
| 6 | 6134 on 5704 | 60 | 14 | 30.2 | 9.3 | 2.7 | 3.6 | 1.8 | 0.9 |
| 7 | 4596 on alumina | 60 | 15 | 32.0 | 16.9 | 11.1 | 8.0 | 5.0 | 1.5 |
| 8 | 4596 on 5704 | 60 | 12 | 28.0 | 16.9 | 6.7 | 3.6 | 2.7 | 2.2 |
| 9 | 9476 on alumina | 60 | 13 | 30.7 | 9.3 | 2.7 | 0.4 | 0 | 0 |
| 10 | 4093 on alumina | 60 | 15 | 29.8 | 20.0 | 16.9 | 5.8 | 0.9 | 1.3 |
| 11 | 6160 Ag on alumina | 60 | 15 | 28.0 | 25.0 | 20.0 | 16.0 | 15.0 | 16.0 |
| 12 | 9922 Cu on alumina | 60 | 14 | 30.0 | 28.0 | 20.0 | 14.0 | 14.0 | 12.0 |

TABLE 3

| Adhesion of DuPont Thick Film Conductors After Thermal Cycling (−40 C. to 125 C. in 1 Hour Cycle) | | | | | | |
|---|---|---|---|---|---|---|
| | | No. of Cycles | | | | |
| | Conductor | 100 | | 500 | | 1000 |
| Ex. No. | Composition | Adhesion (Newtons) | | | | |
| 13 | 9922 Cu | 26.0 | (A) | 11.8 | (A) | 0 (A) |
| 14 | 9924* Cu | 18.9 | (A) | 4.0 | (A) | 0 (A) |
| 15 | 9153 Cu | 25.2 | (A) | 14.9 | (A) | 7.4 (A) |
| 16 | 9163 Cu | 26.1 | (A) | 14.9 | (A) | 10.3 (A) |
| 17 | 6001* Cu | 17.5 | (A) | 8.4 | (A) | 5.1 (A) |
| 18 | 4/062 Δ Cu | 26.9 | (B) | 20.9 | (B) | 12.4 (A) |
| 19 | 4/085 Δ Cu | 28.1 | (C) | 27.7 | (C) | 15.8 (A) |
| 20 | QS170 Ag/Pt | 36.4 | (C) | 18.7 | (A) | 0 (A) |
| 21 | QS180 Ag | 35.9 | (C) | 23.2 | (C) | 10.68 (A) |
| 22 | 6160 Ag | 30.4 | (C) | 25.2 | (C) | 19.9 (A) |
| 23 | 6134* Ag/Pd | 14.0 | (A) | 6.0 | (A) | 0 (A) |

*High frit containing thick film compositions
(A), (B), (C) denotes failure mode. (See Section L above.)
Δ - Experimental thick film pastes The data in Table 3 show that high frit containing compositions, namely 9924 Cu, 6001 Cu and 6134 Ag/Pd have poor thermal cycle adhesion (TCA) performance compared to mixed-bonded, low-frit containing pure or low-alloy Ag and Cu compositions. From these data it is concluded that:

(1) Pure Ag and Cu thick films have higher TCA than Ag/Pd alloy conductors;

(2) Ag/Pd conductors show a significant loss in adhesion after only 100 cycles between −55 and 125C.;
(3) Mixed bonded conductors generally have better adhesion than glass bonded conductors after thermal cycling; and
(4) The TCA of thick film conductors over dielectric is lower than over alumina.

Examples 24-40

Using the above described preparation and testing procedures, a series of 17 tests were performed to determine the effect of overprinting conductive layers on the Aged Adhesion (AA) and Thermocycle Adhesion (TCA) of copper thick films. In Examples 24–35, various copper thick film pastes were tested on alumina using both high and low tin solders. Both the top and bottom layers of the composite conductive layers were copper. Data from these tests are given in Table 4 below.

TABLE 4

Effect of Overprinting on Thermal Cycled Adhesion (TCA) of Copper Thick Films (−40 to +125° C.)

| Ex. No. | DuPont Copper | Solder Composition (Sn/Pb/Ag) | Adhesion in Newtons After Thermal Cycling | | | | | | | |
|---|---|---|---|---|---|---|---|---|---|---|
| | | | 0 | | 100 | | 240 | | 1000 | |
| | | | C | P | C | P | C | P | C | P |
| 24 | 6022 | 60/40 | 35 | C | 37 | C | 35 | A | 16 | B |
| 25 | | 10/88/2 | 29 | B | 28 | B | 26 | C | 0 | B |
| 26 | 6022/ | 60/40 | 37 | A | 32 | A | 33 | A | 22 | B |
| 27 | 9926 | 10/88/2 | 30 | A | 33 | B | 27 | A | 0 | B |
| 28 | 9161 | 60/40 | 29 | A | 31 | B | 31 | B | 0 | A |
| 29 | | 10/88/2 | 23 | B | 24 | B | 19 | B | 0 | B |
| 30 | 9161/ | 60/40 | 26 | A | 27 | A | 34 | A | 21 | B |
| 31 | 9926 | 10/88/2 | 22 | A | 26 | A | 24 | A | 11 | A |
| 32 | 9922 | 60/40 | 37 | C | 33 | C | 36 | C | 19 | B |
| 33 | | 10/88/2 | 29 | B | 24 | B | 19 | B | 0 | B |
| 34 | 9922/ | 60/40 | 36 | A | 31 | A | 33 | A | 24 | B |
| 35 | 9926 | 10/8/2 | 32 | A | 31 | A | 30 | C | 12 | B |

C = Cycles
P = Predominant Failure Mode

The data in Table 4 show potential improvements in the TCA after 1000 cycles of Cu conductors overprinted with low frit Cu paste. It can be seen, however, that the extent of the benefit of overprinting Cu on Cu also depends on solder type and binder composition. In general, ductile, low frit, thick film conductors exhibit better TCA but have poorer AA than high frit compositions. However, good AA and TCA can be obtained by overprinting a conductor with good TCA/poor AA with a conductor having Good AA/Poor TCA. This is shown in Table 5 for QS 175 AG overprinted with QS 191 (Example 39). However, poor TCA results when 6134 is overprinted with QS 191 (Example 40). Since 6134 and QS 191 have high glass content any cracks due to thermal cycling can propagate readily through the composite film causing failure. In the QS 175/QS 191 case, the ductile low frit QS 175 Ag layer stops the crack, thereby resulting in improved TCA performance. For this reason, composite films should be designed with a ductile, low frit mixed bonded first layer having good TCA overprinted by a second layer having good AA.

TABLE 5

Aged Adhesion (150° C.) and Thermal Cycled Adhesion (−40 to +125° C.) of Single vs. Composite Thick Films Conductors

| Ex. No. | Composite Conductor | | | Aged Adhesion Newtons - Hrs. at 150 C. | | | | Therm. Cyc. Adhesion Newtons - No. of Cyc. −40 to +125° C. | | | |
|---|---|---|---|---|---|---|---|---|---|---|---|
| | Comp. | Bottom | Top | 240 | 500 | 750 | 1000 | 240 | 500 | 750 | 1000 |
| 36 | Cu | QS191 | — | 22 | 23 | 23 | 20 | 3 | 0 | 0 | 0 |
| 37 | Ag | QS175 | — | 10 | 10 | 8 | 8 | 29 | 30 | 23 | 28 |
| 38 | Ag—Pd | 6134 | — | 32 | 31 | 30 | 30 | 26 | 19 | 7 | 5 |
| 39 | Ag/Cu | QS175 | QS191 | 31 | 25 | 25 | 27 | 32 | 30 | 29 | 27 |
| 40 | Ag—Pd/Cu | 6134 | QS191 | 22 | 22 | 19 | 21 | 4 | 0 | 0 | 0 |

The data in Table 5 show that QS 191 Cu alone has good Aged Adhesion but very poor TCA. On the other hand, Ag alone exhibits rather poor Aged Adhesion but excellent TCA and Ag-Pd alloy exhibited very good aged adhesion, but rather poor TCA after 750 cycles. Nevertheless, when Cu was overprinted on Ag, excellent aged adhesion and TCA were both obtained.

Examples 41-44

A further series of four tests was conducted in the same manner to observe the effect of edge encapsulation as described hereinabove. In these tests, the overlap of the dielectric over the outer edges of the conductive layer was on the order of 250 microns in order to insure that no area of substrate was exposed due to misregistration of the patterns. However, 100–125 microns overlap is believed to be adequate provided there are no gaps due to misregistration.

Table 6 below summarizes adhesion peel test results after 500 and 880 cycles from −50 to +150° C. In the standard peel test design, the predominant failure mode is at the metal/dielectric interface (Type A). However, in the modified (edge encapsulated) peel test configuration, the observed failure mode is by fatigue cracking in the solder (Type B). Therefore edge encapsulation not only enhances thermal cycle performance but the failure mode is changed from the metallization to the solder. It is therefore apparent that the thermal cycle performance of these thick film compositions can be improved by using a different solder composition with a greater fatigue strength than 60 Sn/40 Pb solder and by changing the solder joint design (edge encapsulation).

TABLE 6

(Thermal Cycled Adhesion of 9153 Copper (−50 to +150° C.) Standard vs. Modified Peel Test Configuration)

| | Example No. | | | |
|---|---|---|---|---|
| | 41 | 42 | 43 | 44 |
| Copper | 9153 | 9153 | 9153/ 9926 | 9153/ 9926 |
| Peel Test Configuration | Std. | Mod. | Std. | Mod. |
| Dielectric | 4575D | 4575D | 4575D | 4575D |
| Solder | 60/Sn/ 40 Pb | 60/Sn/ 40 Pb | 60/Sn/ 40 Pb | 60/Sn/ 40 Pb |
| Flux | A-611 | A-611 | A-611 | A-611 |
| Temp, °C. | 230 | 230 | 230 | 230 |
| Thermal Cycled Adhesion Newtons | | | | |
| 500 Cycles | 15 | 26 | 19 | 32 |
| PFM | A | C | A | C |
| 880 Cycles | 0 | 16 | 12 | 23 |
| PFM | A | B | A | B |

I claim:

1. A method for making thick film/solder joints having a preselected area comprising the sequential steps of
   (1) applying to an electrically-non-conductive substrate a patterned layer having a preselected solder pad area of a first thick film conductive composition comprising finely divided particles of (a) 85.0-98.5% wt. of a pure unalloyed ductile conductive metal or low alloy thereof having a particle size of 0.5-5 microns, (b) 1-10% wt. inorganic binder; and (c) 0.5 to 5.0% wt. spinel-forming metal oxide, all of (a), (b) and (c) being dispersed in organic medium;
   (2) firing the first thick film conductive composition layer to effect volatilization of the organic medium therefrom and liquid phase sintering of the inorganic binder;
   (3) applying over only the solder pad area of the fired first thick film conductive layer a layer of second thick film conductor composition comprising (a) 94.0-99.3% wt. pure unalloyed conductive metal or low alloy of a metal selected from Au, Ag, and Cu having a particle size of 0.5-10 microns, (b) 0.2-1.0% wt. inorganic binder, and (c) 0.5-5.0% wt. spinel-forming metal oxide, all of (a), (b) and (c) being dispersed in organic medium;
   (4) firing the second thick film conductive layer to effect volatilization of the organic medium therefrom and liquid phase sintering of the inorganic binder; and
   (5) forming the solder joint by applying to the solder pad area of the fired second thick film conductive layer a layer of soft solder having a melting point of 120-300C.

2. The method of claim 1 in which before step (5) a pattern of thick film dielectric composition comprising finely divided particles of glass dispersed in organic medium is applied to the exposed areas of the substrate circumscribing the solder pad area and to the outer edges of the thick film conductor within the solder pad area and the dielectric layer is fired to effect volatilization of the organic medium therefrom and liquid phase sintering of the glass.

3. The method of claim 1 in which the solder layer is applied by printing a thick film solder paste onto the solder pad area and drying the paste to remove the organic solvent therefrom.

4. The method of claim 1 in which the solder layer is applied by dipping the solder pad area in a molten solder bath to form a solder coating thereon, removing the solder pad area from the molten solder bath and cooling the applied solder coating.

5. The method of claim 2 in which the glass in the thick film dielectric layer is crystallizable under the firing conditions.

6. The method of claim 1 or 2 in which the conductor metal or low alloy thereof in the first conductive layer is Ag and the conductive metal or low alloy thereof in the second conductive layer is Cu.

7. A method for making a thick film/solder joint having a preselected area comprising the sequential steps of:
   (1) applying to an electrically non-conductive substrate a patterned layer having a preselected solder pad area of a thick film conductive composition comprising finely divided particles of (a) 85.0-98.5% wt. of a pure unalloyed conductive metal or low alloy thereof selected from Au, Ag and Cu having a particle size of 0.5-5 microns, (b) 1-10% wt. inorganic binder, and (c) 0.5-5.0% wt. spinel-forming metal oxide, all of (a), (b) and (c) being dispersed in organic medium;
   (2) firing the thick film conductive composition layer to effect volatilization of the organic medium therefrom and liquid phase sintering of the inorganic binder;
   (3) applying over the exposed areas of the substrate circumscribing the solder pad area and to the outer edges of the thick film conductor within the solder pad area a thick film dielectric composition comprising finely divided particles of glass dispersed in organic medium;
   (4) firing the thick film dielectric composition to effect volatilization of the organic medium therefrom and sintering of the glass therein; and
   (5) forming the solder joint by applying to the surface of the thick film conductive composition which remains exposed on the solder pad area a layer of soft solder having a melting point of 120-300C.

8. The method of claim 7 in which the solder layer is applied by printing a thick film solder paste onto the solder paste area and drying the paste to remove the organic solvent therefrom.

9. The method of claim 7 in which the solder layer is applied by dipping the solder pad area in a molten solder bath to form a solder coating, removing the solder pad area from the molten solder bath and cooling the applied solder coating.

10. The method of claim 7 in which the glass in the thick film dielectric layer is crystallizable under the firing conditions.

* * * * *